(12) United States Patent
    Sekihara (10) Patent No.: US 9,389,499 B2
(45) Date of Patent: Jul. 12, 2016

(54) PELLICLE AND AN ASSEMBLY OF PHOTOMASK PLUS PELLICLE

(71) Applicant: SHIN-ETSU CHEMICAL CO., LTD., Tokyo (JP)

(72) Inventor: Kazutoshi Sekihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 272 days.

(21) Appl. No.: 14/245,689

(22) Filed: Apr. 4, 2014

(65) Prior Publication Data

US 2014/0315122 A1 Oct. 23, 2014

(30) Foreign Application Priority Data

Apr. 22, 2013 (JP) .................................. 2013-89101

(51) Int. Cl.
  *G03F 1/64* (2012.01)
  *G03F 1/22* (2012.01)
  *G03F 1/00* (2012.01)

(52) U.S. Cl.
  CPC *G03F 1/22* (2013.01); *G03F 1/142* (2013.01); *G03F 1/64* (2013.01); *Y10T 428/24008* (2015.01)

(58) Field of Classification Search
  CPC ..................................... G03F 1/64; G03F 1/62
  USPC ............................................................. 430/5
  See application file for complete search history.

(56) References Cited

U.S. PATENT DOCUMENTS

| 6,340,541 B1* | 1/2002 | Yoo ........................... G03F 1/64 428/14 |
| 2005/0045262 A1* | 3/2005 | Eschbach .................. G03F 1/64 156/60 |
| 2008/0063952 A1 | 3/2008 | Shirasaki |
| 2008/0248407 A1 | 10/2008 | Shirasaki |
| 2011/0081603 A1 | 4/2011 | Shirasaki et al. |
| 2012/0122024 A1 | 5/2012 | Shirasaki |

FOREIGN PATENT DOCUMENTS

| JP | 4-152344 A | 5/1992 |
| JP | 2008-65258 A | 3/2008 |
| JP | 2008-256925 A | 10/2008 |
| JP | 2011-76042 A | 4/2011 |
| JP | 2012-108277 A | 6/2012 |
| TW | 200919081 A | 5/2009 |
| WO | 2009/008294 A1 | 1/2009 |

OTHER PUBLICATIONS

Extended European Search Report dated Nov. 20, 2014, issued in counterpart European Patent Application No. 14161918.9 w/English translation (6 pages).

(Continued)

*Primary Examiner* — Stephen Rosasco
(74) *Attorney, Agent, or Firm* — Westerman, Hattori, Daniels & Adrian, LLP (57) ABSTRACT

A pellicle was well as an assembly of photomask plus pellicle is proposed in which the conventional agglutinant layer which bonds the pellicle to photomask is replaced by male and female screws and elastic body layer; in particular the pellicle frame is screwed to the photomask while the sealing of the space within the pellicle frame is secured by the elastic body layer.

11 Claims, 4 Drawing Sheets

(56) References Cited

OTHER PUBLICATIONS

Office Action dated Jul. 6, 2015, issued in counterpart Taiwanese Patent Application No. 103114327 w/English translation (5 pages).

Office Action dated Mar. 22, 2016, issued in counterpart Japanese Patent Application No. 2013-089101, with English translation. (5 pages).

* cited by examiner

PELLICLE AND AN ASSEMBLY OF PHOTOMASK PLUS PELLICLE

The present non-provisional patent application claims priority, as per Paris Convention, from Japanese Patent Application No. 2013-89101 filed on Apr. 22, 2013, the disclosure of which is hereby incorporated by reference herein in its entirety.

FIELD OF THE INVENTION

The present invention relates to a pellicle useful as a dust-fender employed in the scenes of manufacturing semiconductor devices, IC packages, printed circuit boards, liquid crystal display panels, organic EL display panels, etc., and also to an assembly of a photomask with such a pellicle.

BACKGROUND TECHNOLOGY

In manufacturing semiconductor devices such as LSI and super-LSI or in manufacturing a liquid crystal display panel or the like, a pattern is made by irradiating a ultraviolet light to a semiconductor wafer or a glass plate for liquid crystal, but if a dust particle is sticking to a photomask used in this stage, the dust particle obstructs the light or reflects it, causing deformation, short circuit or the like in the pattern being transferred, and such phenomena lead to lowering of the quality of the end products.

Thus, these works are usually performed in a clean room, but, even in a clean room, it is yet difficult to keep the photomask clean all the time. Hence, in practice, the exposure light irradiation is conducted only after a surface of the photomask is sheltered by a pellicle as a dust fender. Under such circumstances, foreign particles do not directly adhere to the surface of the photomask, but only onto the pellicle membrane, and thus by setting a photo focus on a lithography pattern on the photomask at the time of lithographing, the foreign particles on the pellicle membrane fail to transfer their shadows onto the photomask and thus no longer become a problem to the image transfer performance.

In general, a pellicle is built up of a pellicle frame, which is an endless frame bar usually made of aluminum, a stainless steel, or the like, and a transparent pellicle membrane usually made of cellulose nitrate, cellulose acetate, a fluorine-containing polymer or the like which transmit light well; this pellicle membrane is attached via dried solution or adhesive to one of the two annular faces (hereinafter referred to as "membrane-side face") of the pellicle frame. On the other one of the two annular faces of the frame (hereinafter referred to as "mask-side face") is laid an agglutinant layer made of a polybutene resin, a polyvinyl acetate resin, an acrylic resin, a silicone resin or the like for attaching the pellicle frame to the photomask, and over this agglutinant layer is laid a releasable liner (separator) for protecting the agglutinant layer.

In recent years, owing to the increased refinement of the exposure light pattern, the problem of the deformation of the photomask caused by pellicle adhesion to it has become more focused. When the photomask and pellicle frame are coupled together via the agglutinant layer, the form of the pellicle frame affects that of the photomask, and thus the pattern described on the surface of the photomask is deformed from the original form.

Various countermeasures have been proposed to solve this problem. For example, IP Publication 1 teaches that by controlling the flatness of the mask-side face of the pellicle frame to 30 micrometers or smaller and the membrane-side face thereof to 15 micrometers or smaller, it is possible to minimize the mask deformation.

Then, in IP Publication 2, it is described that by regulating the thickness and elasticity of the agglutinant layer of the pellicle frame to certain ranges of values, the irregularity in the mask-side face of the pellicle frame is absorbed in the agglutinant layer so that the smoothness of the mask surface is not substantially affected.

IP Publication 3 teaches that by using a soft gel composition as the pellicle agglutinant it is possible to reduce the deformation of the mask, which is caused when the pellicle is adhered to the mask or the like.

Further, IP Publication 4 says that by restricting the stickiness of the agglutinant layer to a low range of 1 N/m through 100 N/m, it is possible to restrict the deformation of the mask caused by the adhesion of the pellicle.

However, these proposals are not proved to be sufficient countermeasures for mitigating the deforming effect of the pellicle frame to the photomask—hence the problem is far from being solved. For example, in the case wherein a soft agglutinant layer is used, when the pellicle is detached from the photomask, traces of the agglutinant layer tend to remain on the surface of the photomask, and their removal and re-cleaning of the frame would be no little problem.

Also, even if the flatness of the agglutinant layer is improved, there remains a problem in that unless the frame is adhered to the photomask under a large pressure, an air pool is formed between the agglutinant layer and the photomask so that the adhesion between them is weakened and there may be made an air leak passage across the pellicle frame bar, and thus the reliability is lost. On the other hand, if, in order to solve this problem, the frame is adhered to the mask under a larger pressure, the extent to which the photomask is affected by the form of the pellicle frame increases, and the resultant deformation of the photomask pattern is enhanced.

As such, the fact remains true that there has not yet been proposed a pellicle which is so contrived that the deformation imparted to the photomask by the pellicle as the latter is adhered to the former is sufficiently suppressed and at the same time the pellicle is easily removable from the photomask so that the reliability during the use is high.

LIST OF PRIOR ART PUBLICATIONS

IP Publications

[IP Publication 1] Japanese Patent Application Publication No. 2008-256925
[IP Publication 2] Japanese Patent Application Publication No. 2008-65258
[IP Publication 3] Japanese Patent Application Publication No. 2011-76042
[IP Publication 4] Japanese Patent Application Publication No. 2012-108277

BRIEF DESCRIPTION OF THE INVENTION

Problems the Invention Seeks to Solve

The present invention was contrived in view of the above-mentioned circumstances, and it is an object of the invention to provide a pellicle and an assembly of a photomask with such pellicle, which are so designed that the deformation imparted to the photomask as the pellicle is adhered thereto is sufficiently suppressed, and that the detaching of the pellicle is easy and thus the reliability is high.

In order to attain this object, the present inventor turned his attention to functions of gasket such as O-ring which include the capability of exhibiting high sealing performance under relatively small tightening pressure, and he wondered whether or not this function may be useful for the pellicle frame, and found after repeated experiments that even when an elastic body layer is provided on the pellicle frame 10 and the frame 10 is pressed against the photomask, the deformation imparted to the photomask is small and yet high sealing performance is maintained, and thus possessed the present invention.

Means to Solve the Problem

In particular, the pellicle of the present invention includes a pellicle frame having at least four side bars, and it is characteristic in that at each of the four or more corners of the pellicle frame is formed a female screw which extends from the mask-side face toward the membrane-side face, and an elastic body layer is provided on the mask-side face.

The shape of the elastic body layer is preferably such that when the pellicle is adhered to the photomask, the width by which the elastic body layer contacts with the photomask surface is 0.3-1.0 mm, and that when cut orthogonally to the frame bar the cross section of the elastic body layer is roughly semicircular or arched with the top of the cross section being right above the center line of the mask-side face. The hardness of the elastic body layer is preferably 50 degrees or smaller in terms of durometer hardness type A, and the material for the elastic body is preferably selected from a silicone resin, a fluorine-modified silicone resin, an EPM resin, an EPDM resin, an SBS resin and an SEBS resin. Furthermore, the surface of the elastic body layer is preferably not sticky.

The photomask to be coupled with the pellicle of the present invention is characteristic in that it has a through hole at each location which coincides with the respective female screw. Also, this through hole is preferably either tapered or stepped with the end opening in the face of the photomask that is opposite the pattern-bearing face is larger, and this through hole is adapted to receive a fastening device having a male screw in the front end, and the fastening of the pellicle is effected as the male screw and the female screw are engaged with each other.

Effects of the Invention

In the present invention, the pellicle and the photomask are coupled together with the elastic body layer having a function of gasket interposed between them and are fastened together by the thread-cut fastening device, so that there is no need for the agglutinant layer and thus no problem of traces of the agglutinant layer remaining on the photomask surface, and thus the cleaning of the photomask after the pellicle is removed becomes quite easy. Also, the elastic body layer of the present invention collapses easily without creating air pools, it is possible to effect perfect sealing with very small pressure, so that it is possible to substantially reduce the deformation of the photomask caused by the adhesion of the pellicle to it and at the same time, since the tightening is done by the screw, the reliability of the sealing is high, and the removal of the pellicle is easy.

EXAMPLES TO EMBODY THE PRESENT INVENTION

We will now explain an example of how the present invention is embodied, but the scope of the present invention shall not be construed any way limited by the example.

Figure 1:
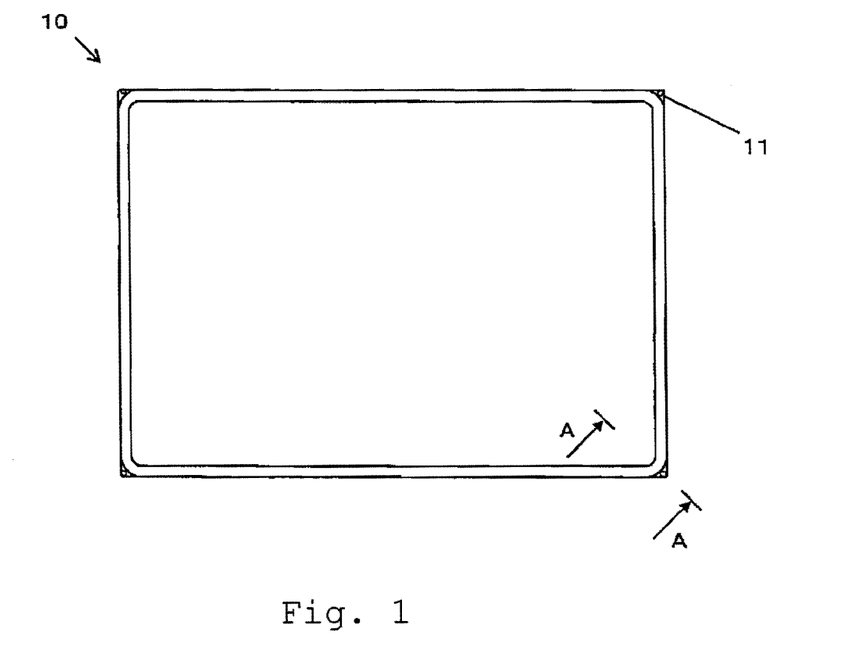
FIG. 1 is a top plan view of a pellicle frame representing one embodiment of the present invention.
Figure 2:
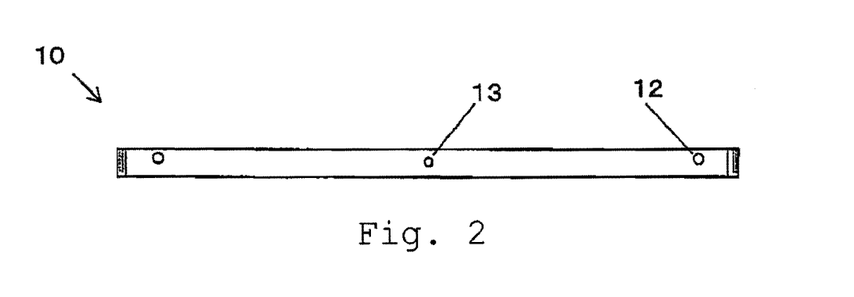
FIG. 2 is a side view of a pellicle frame representing one embodiment of the present invention.
Figure 3:
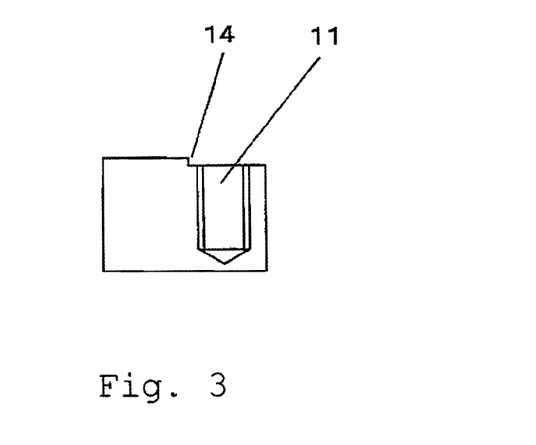
FIG. 3 is an enlarged cross section of a pellicle frame bar as cut by a plane indicated by A and A in FIG. 1.

FIGS. 1 through 3 show an example 10 of the presently invented pellicle frame. FIG. 1 is a top plan view of it seen from the photomask side, the frame has a rectangular shape with female screw 11 at each corner. This female screw 11 is dug from the photomask side and extends toward the pellicle membrane, and it is preferable that, as in this example, it does not penetrate the frame; but if the dimension or machining circumstances demand, it can penetrate it.

This female screw 11 is directly cut in the pellicle frame 10, but it is possible to insert a ready-made threaded screw sleeve in the frame 10 to create the female screw 11. It is also possible to add a locking member such as a threadably-locking pin, a side stop pin or a locking screw (not shown). The pellicle frame 10 may be made of an aluminum alloy, an iron-based alloy such as carbon steel and stainless steel, an engineering resin such as PEEK, and a fiber-reinforced plastic.

The flatness of the pellicle frame 10 is preferably 30 micrometers or smaller, and more preferably 15 micrometers or smaller. It is possible to produce non-penetrating jig holes 12 for handling and a penetrating hole 13 for ventilation in the pellicle frame bar as shown in FIG. 2.

Figure 4:
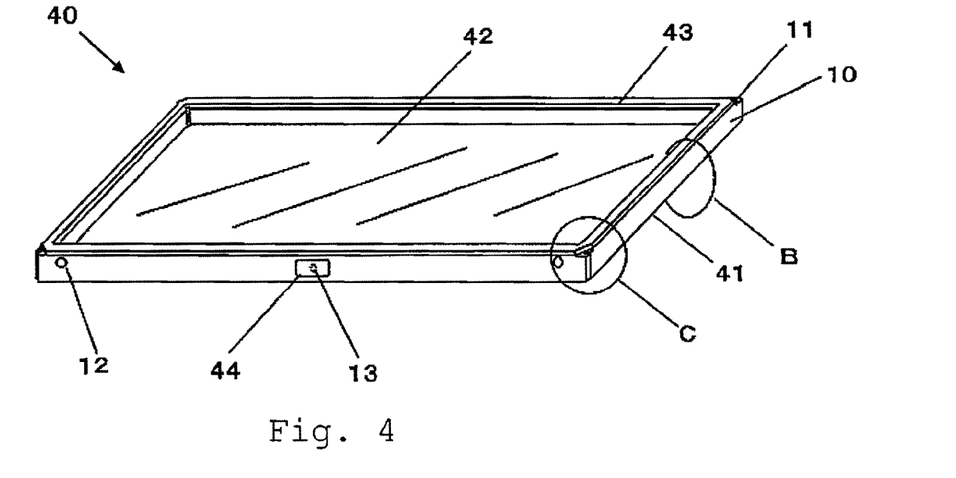
FIG. 4 is a perspective view of a pellicle representing one embodiment of the present invention.

FIG. 4 is a perspective view of a pellicle 40 fabricated from the thus made frame 10, seen from the photomask side. In the case of the embodiment of FIG. 4, the female screws 11 appear to be made only at the four corners, but if the sides of the pellicle frame 10 are relatively long, it is preferable that the female screws are made at other locations of the frame in addition to the corners. The shape of the pellicle frame is not limited to rectangle, and in consideration of the positions of the female screws 11, it is possible that the frame is circular or octagonal.

The membrane-side face of the pellicle frame 10 is provided with an adhesive layer 41 made of an acrylic resin, silicone resin, fluorine-containing resin, or the like, and a pellicle member 42 is adhered to the frame via the adhesive layer 41 in a slack-free manner. On the opposite mask-side face of the frame 10 is laid an elastic body layer 43, which has a cross section of roughly semicircular shape, as shown in FIG. 5, the top of the cross section being right above the center line of the mask-side face of the frame 10.

Figure 5:
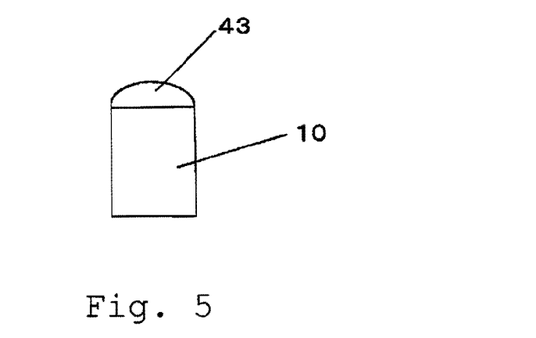
FIG. 5 is a cross section taken from part B of FIG. 4.
Figure 6:
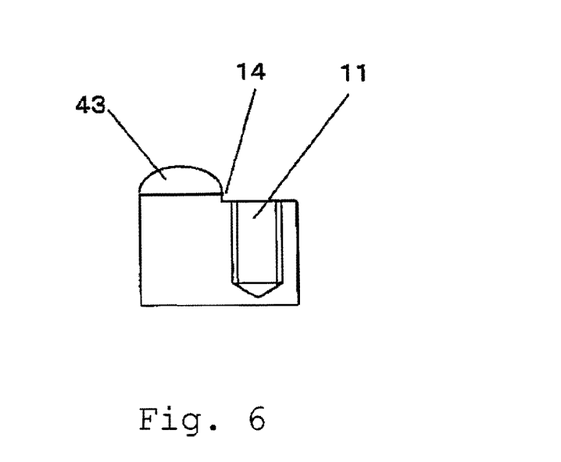
FIG. 6 is a cross section taken from part C of FIG. 4.

This elastic body layer 43 is formed to cover the entire width of the frame bar 10 in the case of FIG. 4 and FIG. 5, but it is possible to lay the elastic body layer 43 to cover only a part of the width. However, it is necessary, as shown in FIG. 6, that the elastic body layer 43 lies inner than any female screw 11, as shown in FIG. 6, whether the female screw 11 is at a corner or somewhere between the corners. In the case of this embodiment, the mask-side face of the frame has a step 14 at each corner of the frame. This step 14 provides a boundary mark for the application of the elastic body layer 43 to thereby restrict the application width, and also prevents the applied elastic body from flowing into the female screw 11.

In the present invention, since there is no need for the pellicle frame 10 to be glued to the photomask base plate 70, the surface of the elastic body layer 43 of the pellicle frame 10 is preferably not sticky; but on account of a consideration that if the surface of the elastic body layer 43 has a weak stickiness, the pellicle 40 as it is laid on the photomask before the screwing, the pellicle 40 is not easily budged and thus operation efficiency is improved, so that it is possible to employ a weakly adhesive elastic body.

From the viewpoint of such considerations as well as ozone resistance, gas generation, light resistance, hardness, formability and the like, it is preferable that the elastic body layer 43 is made of a silicone resin, a fluorine-modified silicone resin, an EPM resin, an EPDM resin, an SBS resin or an SEBS resin. Any resin other than these may be used to make the elastic body layer 43 so long as it is possible to be applied and formed on the pellicle frame 10; however, a material that must be vulcanized using sulfur is not appropriate since it may trigger creation of haze during the use of the pellicle.

The configuration of the elastic body layer 43 is preferably designed in a manner such that when it is abutted on the photomask base plate 70, the width by which the elastic body layer 43 contacts with the photomask base plate 70 is 0.3-1.0 mm, and more preferably 0.4-0.6 mm from the viewpoints of reliability and the load imposed during the coupling operation. If this contact width is less than 0.3 mm, the pressure to be imposed during the coupling operation would be too small to secure sealing effect, and if it is more than 1.0 mm, the imposed pressure ought to be higher and the collapse amount of the elastic body layer 4 becomes so great that the resultant repellent force would become great enough to cause the photomask base plate 70 to undergo substantial deformation. This contact width is defined as a width of the elastic body layer which is seen in different color tone from the other part(s) thereof, when seen from the photomask side through the glass, the change in color tone being created owing to the contact with the glass, and it can be measured by means of a magnifying glass of low magnification such as stereoscopic microscope.

Furthermore, the hardness of the elastic body layer 43 is preferably chosen to be 50 degrees or smaller in terms of durometer hardness type A, in order to secure that the elastic body layer 43 is suitably collapsed by the locking member 101 in a manner such that the contact width of the elastic body layer of the pellicle with photomask base plate 70 becomes 0.3-1.0 mm.

It is therefore suitable that the dimensions and hardness of the elastic body layer 43 as well as the tightening magnitude imparted to the photomask base plate 70 by the locking member 101 are adjusted to attain that the resultant contact width of the elastic body layer of the pellicle with photomask base plate 70 becomes 0.3-1.0 mm. Also, the flatness along the ridge of the elastic body layer 43 should be as good as possible and it is preferably 30 micrometers or smaller, and more preferably 10 micrometers or smaller.

The pellicle 40 of the present invention is constructed as described above, and thus the deformation that is propagated to the photomask base plate 70 when the pellicle 40 is adhered to the plate 70 is substantially reduced. This effect is especially conspicuous when the invention is applied to a photomask base plate for semiconductor applications wherein high precision tooling is required; but the applicability of the present invention is not limited by the size of the pellicle 40, but the invention can be applied to both the pellicles for semiconductor manufacturing having a side length of as small as about 150 mm and those for display manufacturing having a side length of as large as 1000 mm or greater.

Figure 8:
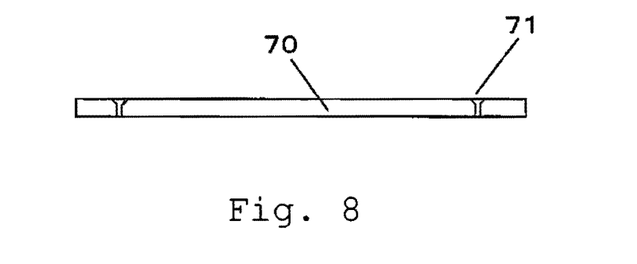
FIG. 8 is a cross section of photomask as cut by a plane indicated by D and D in FIG. 7.
Figure 9:
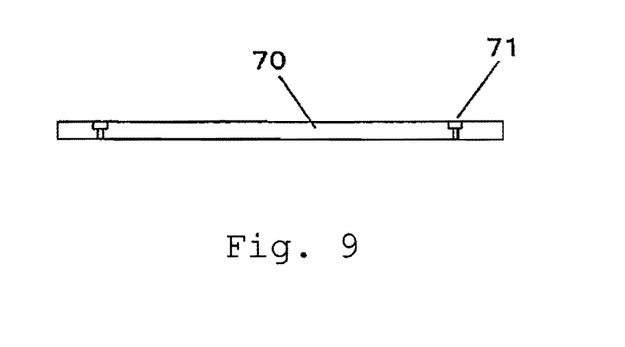
FIG. 9 is a cross section of the photomask as cut by a plane indicated by D and D in FIG. 7 in another different embodiment of the invention.

Next, we will explain about the photomask base plate 70 to which the pellicle 40 of the present invention is attached. The photomask base plate 70 of the present invention is formed with through holes 71 which are positioned to coincide with the female screws 11 of the pellicle 40. These through holes 71 have a larger diameter at the opening which is remote from the pattern bearing face of the photomask base plate 70, and it is preferable that the through holes 71 are tapered as shown in FIG. 8 or are stepped as shown in FIG. 9. The reason for selecting these shapes is, as described later, to contain the locking member 101 such that the top part of the member 101 does not extend beyond the surface of the photomask base plate 70; it necessary to control the precision of the depth of the taper dimension or the step depth lest the relative position of the pellicle 40 to the photomask base plate 70 should depart from acceptable dimension.

In the case where the tapered shape is adopted, an advantage is that the possibility of dust generation is lower, and in the case where the stepped shape is adopted, it becomes possible to control, with a higher precision, the depth at which the locking member 101 is stopped so that the relative position of the pellicle 40 to the photomask base plate 70 and the tightening strength imparted to the elastic body layer 43 are controlled with higher precisions.

Next, an embodiment of how the pellicle 40 is attached to the photomask base plate 70 will be explained, and this embodiment is in the case wherein the photomask base plate 70 is formed with through holes 71 of stepped shape, as shown in FIG. 9.

The pellicle 40 is fixed as it is tightened by the locking member 101, which are inserted from that face of the photomask base plate 70 which is remote from the pattern-bearing face thereof. The locking member 101 is a cylindrical shaft with a step 112 between a front part and a middle part thereof. The front part consists of a male screw 111, and the middle part consists of a cylindrical body 114, and a head end consists of a large diameter part 113. It is preferable that the end face of this large diameter part 113 is formed with groove(s) in the shape of + or − or has a recess in the form of square, hexagon, etc. (not shown) so as to enable tightening or loosening of the locking member 101 with a wrench.

Since the pellicle 40 of the present invention is fixed by this locking member 101, there is a concern that dust may occur when the male screw 111 tightly engages with the female screw 11, but because the pattern-bearing part of the photomask base plate 70 is completely sealed from the screws by the elastic body layer 43, there occurs no such problem as contamination of the pattern with dust The position of the step 112 of the locking member 101 or the length of the cylindrical middle part 114 directly affects the distance (clearance) between the pellicle 40 and the photomask base plate 70 and hence the extent to which the elastic body layer 43 is depressed, so that it is important not only to control the position of the step in the through hole 71 of the photomask base plate 70, as described above, but also to adjust the length of the middle part 114 very carefully, and it is necessary to make the length of the cylindrical middle part 114 as uniform as possible among the locking members 101.

The dimension of the through hole 71 penetrating the photomask base plate 70, the dimension of the step 14 of the pellicle frame and the length of the cylindrical middle part 114 of the locking member 101 (or the position of the step 112) are determined in response to the thickness of the photomask base plate 70 to which the pellicle 40 is attached, the height of the pellicle frame 10, the height of the elastic body layer 43 and the standoff (the distance between the pellicle membrane and the pattern-bearing face of the photomask), but it is preferable that the designing of each dimension is made in a manner such that the width by which the elastic body layer 43 and the photomask base plate 70 contact with each other falls in the range of 0.3-1.0 mm, the exact width being dependent at least on the extent to which the elastic body layer 43 is depressed.

In installing the pellicle 40, if the locking member 101 is overly wrenched, for example, the fixation of the pellicle 40 is highly secured, but the amount of depression of the elastic body layer 43 becomes so large that the repulsive force is increased to cause greater deformation of the photomask base plate 70. Therefore, it is preferable to design the length of the middle part 114 of the locking member 101 and the shape and the hardness and the depression amount of the elastic body layer 43 in a manner such that the variation of the flatness of the photomask base plate 70 is 10% or less.

Also, in the pellicle 40 of the present invention the elastic body layer 43 is convexed so that it tends to have a narrow contact width, but even with such a narrow contact width it can securely seal the interior of the frame even when it is pressed under a very low load. Also, in the present invention, there is no need for vertically supporting the weight of the pellicle 40 with the conventional adhesive layer, so that the narrowness of the contact width is not a cause for a problem.

Next, we will explain how the pellicle 40 is removed from the photomask base plate 70. This operation of removing the pellicle 40 can be achieved by only loosening of the locking member 101 so that there is no need for the conventionally employed tools used for removal of the agglutinant layer. Also, since there is no need for removing the remnant of the agglutinant layer from the photomask base plate 70 by washing, the rewashing operation becomes very simple, and the operation time is drastically shortened and it can rarely happen that the photomask base plate becomes unusable on account of the contamination with the traces of the agglutinant layer.

As explained above, the pellicle 40 of the present invention brings about a large advantage on the occasions of fixing, removal and replacement of the pellicle 40, but there are other advantages also such as when the photomask base plate 70 is found to have a problem after the pellicle 40 is fixed. In particular, in a case where a foreign particle is found on the pattern-bearing face of the photomask base plate 70 after the pellicle 40 is fixed, it is easy to remove the pellicle 40 by loosening the locking member 101 and similarly it is easy to re-fix the pellicle 40 after removal of the foreign particle from the photomask base plate 70.

Also, since no agglutinant layer is used in the pellicle 40 of the present invention, there is no need for removing the traces of the agglutinant layer from the pellicle 40 by wet cleaning so that the operation time can be greatly reduced, and it is possible to use again the pellicle 40 after the removal so that the pellicle 40 is rarely disposed of after a single use.

Example

Next, we will explain about an example of the present invention, and in this example, a pellicle frame 10 having an appearance as indicated in FIG. 1 and FIG. 2 was manufactured by machining. This rectangular pellicle frame 10 had an external dimension of 115 mm×149 mm, an internal dimension of 111 mm×145 mm, and a height of 3.5 mm. The flatness of the pellicle was 20 micrometers, and jig holes 12 were made in the outer wall of each one of the longer-side pellicle frame bars for handling operation, and penetrating vent hole 13 was made through each one of the longer-side pellicle frame bars. The pellicle frame 20 was made of an aluminum alloy A7075, and after the machining a black color alumite treatment was applied to the frame surface. Each corner of this pellicle frame 10 was formed with a step 14 having a height of 0.15+/−0.01 mm, as shown in FIG. 3, and was formed with a non-penetrating female screw 11 having a diameter of 1 mm and a pitch of 0.2 mm, the screw 11 being located exterior to the step 14.

Next, the thus prepared pellicle frame 10 was transported to a cleanroom, and it was washed with a surfactant and pure water, and, after being dried, it was made into a pellicle as shown in FIG. 4 in the following manner. An adhesive layer 41 made of a fluorine-containing resin was applied to the membrane-side face of the pellicle frame 10, which is the face not cut with the female screw 11, and a pellicle member 42 of a fluorine-containing resin CYTOP (a product name of ASAHI GLASS CO., LTD.), which had been prepared by spin coating, was adhered to the membrane-side face. To the mask-side face of the pellicle frame 10 was applied a fluorine-modified silicone resin SIFEL (a product name of Shin-Etsu Chemical Co., Ltd.), and it was hardened to form an elastic body layer 43 having a height of 0.55 mm and a durometer hardness Type A of 35 degrees. This elastic body layer 43 was convexed as shown in the cross sectional view of FIG. 5, and, as shown in FIG. 6, the elastic body layer 43 was laid to lie inner than the female screws 11 at the corners, and a vent hole 13 is shielded with a membrane filter 44, which is glued to the pellicle frame via an acrylic adhesive.

Figure 7:
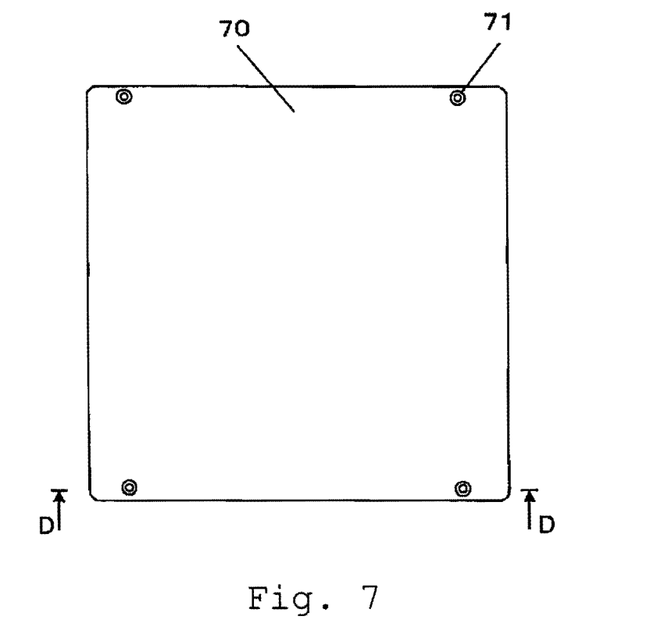
FIG. 7 is a top plan view of a photomask base plate representing one embodiment of the present invention.

As for the photomask base plate 70, a plate made of synthetic quartz having a dimension of 152 mm×152 mm and a height of 6.35 mm and a flatness of 0.27 micrometer, shown in FIG. 7 and FIG. 9, was prepared. A true photomask base plate would be formed with a light shield layer made of Cr, Mo, Si or the like on its pattern-bearing face, but in this embodiment it was omitted. In the vicinity of each of the four corners of the photomask base plate 70 was made a through hole 71 by machining with a diamond cutter, the hole 71 having an inner diameter of 3.2 mm at one end thereof and an inner diameter of 1.5 mm at the other end thereof, and a step at a depth of 2.5+/−0.01 mm from said one end (larger end).

Figure 10:
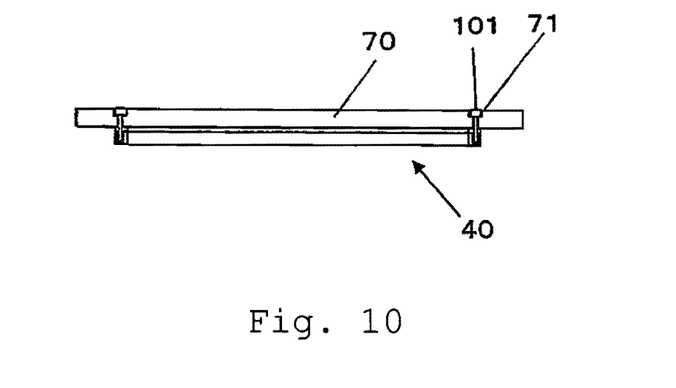
FIG. 10 is a cross section of the pellicle-photomask assembly of the present invention.
Figure 11:
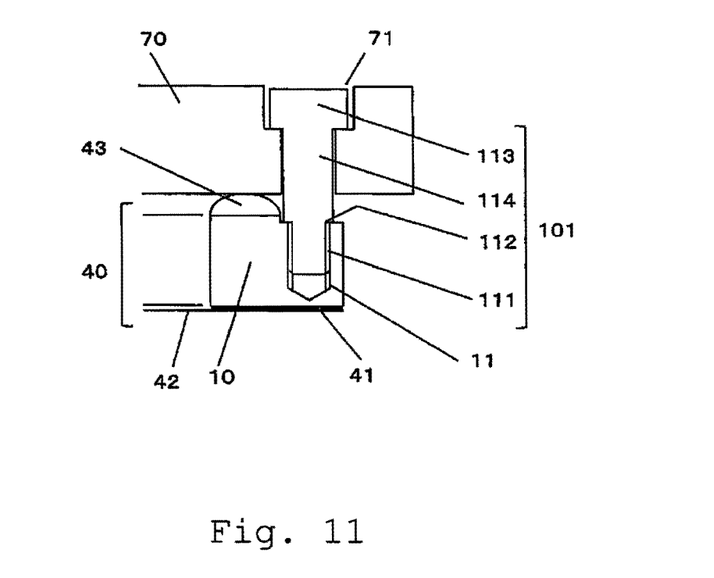
FIG. 11 is an enlarged cross section of the assembly taken from a corner area of the pellicle frame of FIG. 10.

To that face of the photomask base plate 70 which has the smaller end of the through hole 71 was attached the pellicle 40 by means of locking members 101. FIG. 10 and FIG. 11 show the cross sections after the attachment is done. The locking member 101 used was made of stainless steel of a grade SUS304, and was machined to have a middle cylindrical part 114 of a diameter of 1.25 mm and a length of 4.5+/−0.01 mm. The male screw 111, which had a diameter of 1 mm and a pitch of 0.2 mm and constituted the front part of this locking member 101, was forced to engage with the female screw 11 of the pellicle frame 10 until it was stopped by the step 112, and thus the pellicle 40 was fixed. On this occasion, the depression of the elastic body layer 43 was about 0.05 mm in height, and the contact width was about 0.5 mm, and the layer 43 was found to maintain this width throughout the pellicle frame without a breakage or substantial increase or decrease in the contact width.

The flatness of the photomask base plate 70 was observed to be 0.28 micrometers, which is an increase of only 0.01 micrometer from the original 0.27 micrometer, so that it was found that the deforming effect of the pellicle 40 to the base plate 70 had been substantially suppressed.

In the end, the locking member 101 was loosened, and the pellicle 40 was removed from the photomask base plate 70, and the position of the photomask base plate 70 where the elastic body layer 43 had been in contact was inspected in a dark room with a light focus lamp. Although a very faint line mark, which showed where the elastic body layer had been, was observed, no foreign particles or remnant of the elastic body were observed, so that the photomask base plate was found to have kept its original clean status.

REPRESENTATION OF REFERENCE NUMERALS

10: pellicle frame
11: female screw
12: jig hole
13: vent hole
14: step
40: pellicle
41: adhesive layer for pellicle membrane
42: pellicle membrane
43: elastic body layer
44: filter
70: photomask base plate
71: through hole
101: locking member
111: male screw
112: step
113: large diameter part
114: cylindrical middle part Scopes of what is claimed:

1. A pellicle comprising a pellicle frame having at least four side bars, wherein at each one of at least four corners of said pellicle frame is cut a female screw extending from a first face of said pellicle frame, which is designed to oppose a photomask, towards an opposite second face of said pellicle frame, which is designed to receive a pellicle membrane, and an endless elastic body layer is provided on said first face in a manner such that said elastic body layer lies inward from said female screws.

2. A pellicle as claimed in claim 1, wherein said elastic body layer is designed in a manner such that when said pellicle is attached to said photomask said elastic body layer can contact with said photomask by an area having a width of 0.3 through 1.0 mm.

3. A pellicle as claimed in claim 2, wherein said elastic body layer, when cut orthogonally to a frame bar on which it lies, has a cross section in a shape of arched to semicircular with its top being right above a center line of said frame bar.

4. A pellicle as claimed in claim 1, wherein said elastic body layer, when cut orthogonally to a frame bar on which it lies, has a cross section in a shape of arched to semicircular with its top being right above a center line of said frame bar.

5. A pellicle as claimed in claim 1, wherein hardness of said elastic body layer is 50 degrees or smaller in terms of durometer hardness of type A.

6. A pellicle as claimed in claim 1, wherein said elastic body layer is made of a material selected from a silicone resin, a fluorine-modified silicone resin, an EPM resin, an EPDM resin, an SBS resin and an SEBS resin.

7. A pellicle as claimed in claim 1, wherein surface of said elastic body layer is not sticky.

8. An assembly of photomask plus pellicle,
wherein said pellicle comprises a pellicle frame having at least four side bars, and at each one of at least four corners of said pellicle frame is cut a female screw extending from a first face of said pellicle frame, which is designed to oppose said photomask, towards an opposite second face of said pellicle frame, which is designed to receive a pellicle membrane, and an endless elastic body layer is provided on said first face in a manner such that said elastic body layer lies inward than said female screws; wherein said photomask has a through hole at a location that coincides with respective female screw of said pellicle frame;
wherein said assembly includes locking means with a male screw part for locking said assembly, said locking being effected as said locking means is inserted in said through hole and then in said female screw to thereby effect threaded engagement between said male screw part of said locking means and said female screw of said pellicle frame.

9. An assembly of photomask plus pellicle as claimed in claim 8, wherein said through hole of said photomask is either tapered or stepped so as to have a greater diameter at its one end which opens in a face of said photomask which is remote from said pellicle.

10. An assembly of photomask plus pellicle as claimed in claim 9, wherein said locking means has a step (112) such that a diameter of that part of said locking means which is on the rear side from said step is greater than the diameter of said female screw so that said locking means is stopped as said step reaches said female screw.

11. An assembly of photomask plus pellicle as claimed in claim 8, wherein said locking means has a step (112) such that a diameter of that part of said locking means which is on the rear side from said step is greater than the diameter of said female screw so that said locking means is stopped as said step reaches said female screw.

* * * * *